United States Patent
Chang et al.

(10) Patent No.: US 10,797,057 B2
(45) Date of Patent: Oct. 6, 2020

(54) DRAM SEMICONDUCTOR DEVICE HAVING REDUCED PARASITIC CAPACITANCE BETWEEN CAPACITOR CONTACTS AND BIT LINE STRUCTURES AND METHOD FOR MANUFACTURING THE SAME

(71) Applicant: Winbond Electronics Corp., Taichung (TW)

(72) Inventors: Wei-Che Chang, Taichung (TW); Tzu-Ming Ou Yang, Tainan (TW)

(73) Assignee: Winbond Electronic Corp., Taichung (TW)

( * ) Notice: Subject to any disclaimer, the term of this patent is extended or adjusted under 35 U.S.C. 154(b) by 20 days.

(21) Appl. No.: 16/183,506

(22) Filed: Nov. 7, 2018

(65) Prior Publication Data

US 2019/0312037 A1  Oct. 10, 2019

(30) Foreign Application Priority Data

Apr. 10, 2018 (TW) .............................. 107112264 A

(51) Int. Cl.
*H01L 27/108* (2006.01)
*H01L 21/033* (2006.01)

(52) U.S. Cl.
CPC .... *H01L 27/10885* (2013.01); *H01L 21/0337* (2013.01); *H01L 27/10888* (2013.01)

(58) Field of Classification Search
CPC ......... H01L 27/10885; H01L 27/10888; H01L 21/0337
See application file for complete search history.

(56) References Cited

U.S. PATENT DOCUMENTS

| 6,709,972 | B2 | 3/2004 | Park |
| 6,953,744 | B2 | 10/2005 | Kim et al. |
| 7,034,408 | B1 | 4/2006 | Schloesser |
| 7,592,249 | B2 | 9/2009 | Maekawa |
| 2012/0012912 | A1 | 1/2012 | Kwon |
| 2014/0030883 | A1* | 1/2014 | Kwon ............... H01L 21/28008 438/589 |
| 2014/0175659 | A1 | 6/2014 | Lee et al. |
| 2014/0179092 | A1 | 6/2014 | Kim |
| 2014/0326408 | A1* | 11/2014 | Sun ................... H01L 21/76816 156/345.3 |
| 2015/0126013 | A1* | 5/2015 | Hwang ............... H01L 23/5226 438/381 |

FOREIGN PATENT DOCUMENTS

| TW | 201706988 A | 2/2017 |
| TW | 201724354 A | 7/2017 |

* cited by examiner

*Primary Examiner* — Matthew E. Gordon
(74) *Attorney, Agent, or Firm* — Muncy, Geissler, Olds & Lowe, P.C.

(57) ABSTRACT

A semiconductor device and a method for manufacturing the same are provided. The method includes forming a plurality of bit line structures on a semiconductor substrate, wherein there is a plurality of trenches between the bit line structures. The method also includes forming a first oxide layer conformally covering the bit line structures and the trenches, and forming a photoresist material layer in the trenches and on the first oxide layer, wherein the photoresist material layer has an etch selectivity that is higher than that of the first oxide layer. The method further includes removing the photoresist material layer to form a plurality of capacitor contact holes between the bit line structures, and forming a capacitor contact in the capacitor contact holes.

14 Claims, 24 Drawing Sheets

DRAM SEMICONDUCTOR DEVICE HAVING REDUCED PARASITIC CAPACITANCE BETWEEN CAPACITOR CONTACTS AND BIT LINE STRUCTURES AND METHOD FOR MANUFACTURING THE SAME

CROSS REFERENCE TO RELATED APPLICATIONS

This application claims priority of Taiwan Patent Application No. 107112264, filed on Apr. 10, 2018, the entirety of which is incorporated by reference herein.

BACKGROUND

Field of the Invention

The invention relates to semiconductor devices and methods for manufacturing the same, and in particular to a dynamic random access memory (DRAM) and a method for manufacturing the same.

Description of the Related Art

In a dynamic random access memory (hereinafter referred to as DRAM), the signal ($\Delta V$) released from a discharging capacitor is, in fact, very small. Thus, the signal needs to be enlarged through a sense amplifier, so that the signal of the discharged capacitor can be sensed and read. However, when the signal ($\Delta V$) released from capacitor discharge is too low, it may not be sensed.

The amplified signal of the capacitor is related to the following equation:

$$\Delta V_{BL} = \frac{1/2 \ V_{ary}}{1 + C_{BL}/C_S}$$

According to the foregoing equation, the amplified signal of the capacitor ($\Delta V_{BL}$) is related to the parasitic capacitance ($C_{BL}$) of the bit line (BL) and the capacitance ($C_S$) of the DRAM, wherein one of the methods to increase the amplified signal of the capacitor ($\Delta V_{BL}$) is to decrease the parasitic capacitance of the bit line.

In current DRAMs, active regions of the transistors are formed in semiconductor substrates. Capacitors are disposed on top portions of the active regions, and are bridged through capacitor contacts. Specifically, the bit lines are the nearest elements to the capacitor contacts. There are many factors affecting the parasitic capacitances of the bit lines, the main factor is the parasitic capacitance between the bit line and the capacitor contact (BL-CC capacitance). However, as the feature size produced by the manufacturing process continues to shrink, the distance between bit line and capacitance contact in DRAM has become shorter. Furthermore, as the capacity requirements for DRAM continue to increase, the bit line has become longer. These may lead to raising the parasitic capacitances of the bit lines, and ultimately decreasing the amplified signal of the capacitor ($\Delta V_{BL}$).

Therefore, the industry needs a semiconductor device and a method for manufacturing the same which can decrease the parasitic capacitances of the bit lines.

BRIEF SUMMARY

Some embodiments of the disclosure provide a method for manufacturing a semiconductor device. The method includes forming a plurality of bit line structures on a semiconductor substrate, wherein there is a plurality of trenches between the bit line structures. The method also includes forming a first oxide layer conformally covering the bit line structures and the trenches, and forming a photoresist material layer in the trenches and on the first oxide layer, wherein the photoresist material layer has an etch selectivity that is higher than that of the first oxide layer. The method further includes removing the photoresist material layer to form a plurality of capacitor contact holes between the bit line structures, and forming a capacitor contact in the capacitor contact holes.

Some embodiments of the disclosure provide a semiconductor device. The semiconductor device includes a plurality of bit line structures disposed on a semiconductor substrate, and a first oxide layer disposed on sidewalls of the bit line structures. The semiconductor device also includes a capacitor contact disposed between the bit line structures, wherein the first oxide layer contacts the bit line structures and the capacitor contact. The semiconductor device further includes a nitride layer disposed on the first oxide layer, the bit line structures and the capacitor contact, wherein the nitride layer contacts the top surface of the first oxide layer.

A detailed description is given in the following embodiments with reference to the accompanying drawings.

BRIEF DESCRIPTION OF THE DRAWINGS

The disclosure can be more fully understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1C, 2C, 3C, 4C, 5C, 6C, 7C, 8C, 9C, 10C, 11C, 12C (hereinafter referred to as FIGS. 1C-12C) are top views illustrating an exemplary sequential forming process of a semiconductor device in accordance with some embodiments of the present disclosure, wherein FIGS. 1A-12A are cross-sectional views taken along line A-A of FIGS. 1C-12C, and FIGS. 1B-12B are cross-sectional views taken along line B-B of FIGS. 1C-12C.

DETAILED DESCRIPTION OF THE INVENTION

Figure 1A:
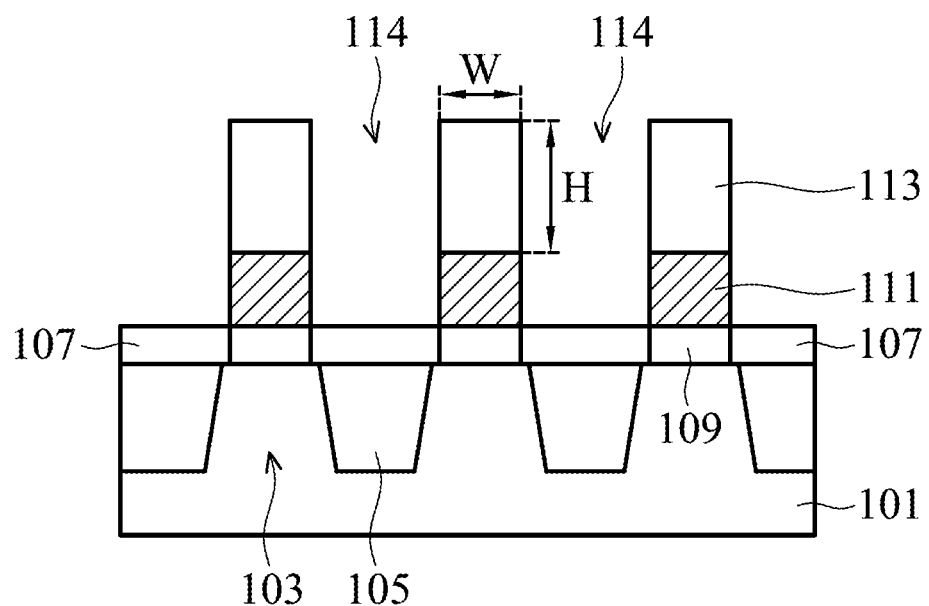
FIGS. 1A, 2A, 3A, 4A, 5A, 6A, 7A, 8A, 9A, 10A, 11A, 12A (hereinafter referred to as FIGS. 1A-12A) are cross-sectional views illustrating an exemplary sequential forming process of a semiconductor device in accordance with some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. The thicknesses of the layers and the regions in the drawings may be enlarged for clarification. In addition, the same or similar reference numerals may be used to indicate the same or similar elements. These will not be repeated in the following disclosure.

FIGS. 1A-12A are cross-sectional views illustrating an exemplary sequential forming process of a semiconductor device 100 in accordance with some embodiments of the present disclosure. FIGS. 1B-12B are cross-sectional views illustrating an exemplary sequential forming process of the semiconductor device 100 in accordance with some embodiments of the present disclosure. FIGS. 1C-12C are top views illustrating an exemplary sequential forming process of the semiconductor device 100 in accordance with some embodiments of the present disclosure, wherein FIGS. 1A-12A are cross-sectional views taken along line A-A of FIGS. 1C-12C, and FIGS. 1B-12B are cross-sectional views taken along line B-B of FIGS. 1C-12C.

Figure 1B:
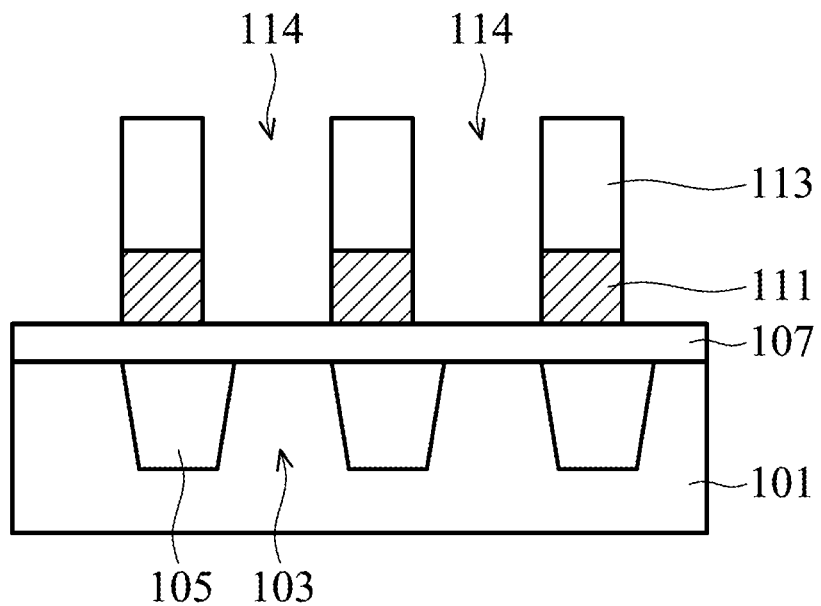
FIGS. 1B, 2B, 3B, 4B, 5B, 6B, 7B, 8B, 9B, 10B, 11B, 12B (hereinafter referred to as FIGS. 1B-12B) are cross-sectional views illustrating an exemplary sequential forming process of a semiconductor device in accordance with some embodiments of the present disclosure.
Figure 1C:
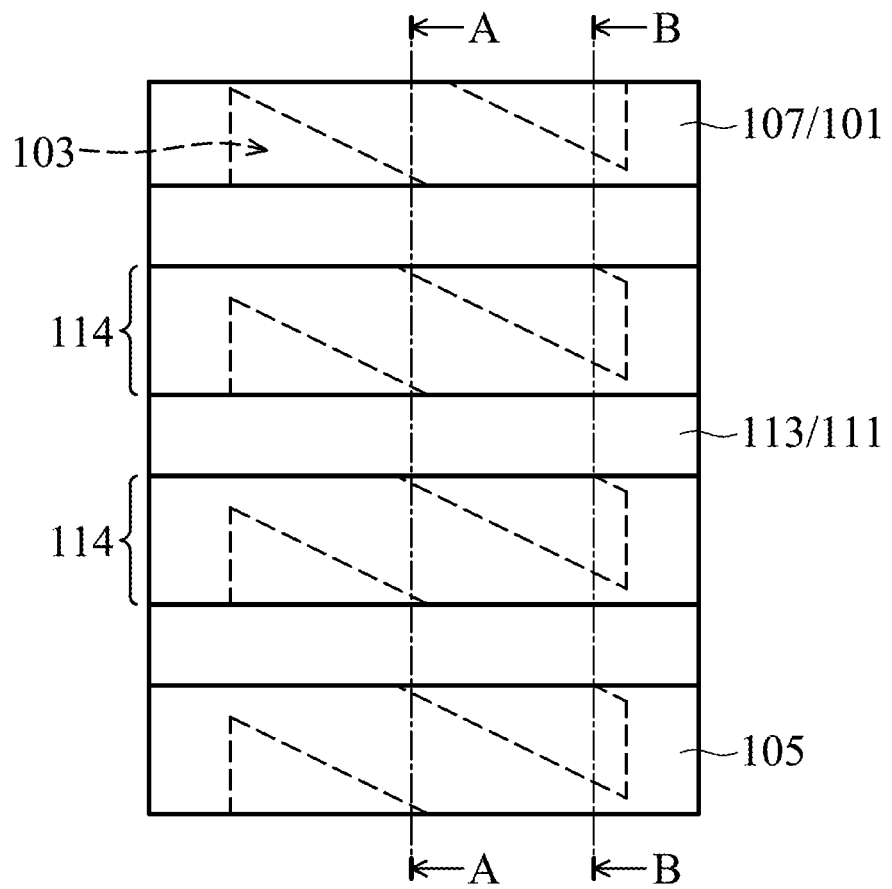

As shown in FIGS. 1A, 1B and 1C, a plurality of isolation structures 105 are formed in a semiconductor substrate 101, and a plurality of active regions 103 are defined by the isolation structures 105. The semiconductor substrate 101 may include a silicon substrate or a silicon germanium substrate. The isolation structures 105 may include shallow trench isolation (STI) structures. In addition, an insulating layer 107 is formed on the semiconductor substrate 101, and a plurality of bit line contacts 109 are formed in the insulating layer 107. The bit line contacts 109 are located between the active regions 103 and the bit line structures 111. In some embodiments, the insulating layer 107 may be made of silicon oxide, and the bit line contacts 109 may be made of polysilicon, metal or another applicable conductive material.

A plurality of bit line structures 111 and a plurality of hard masks 113 are formed on the semiconductor substrate 101. The hard masks 113 are located on the bit line structures 111, and the sidewalls of the hard masks 113 are coplanar with the sidewalls of the bit line structures 111. It is worth noting that, the bit line structures 111 and the hard masks 113 are formed through the same etching process. In some embodiments, the hard masks 113 are made of silicon oxide. The height H of the hard masks 113 is in a range from about 50 nm to about 100 nm, and the width W of the hard masks 113 is in a range from about 15 nm to about 20 nm. In addition, the bit line structures 111 may be a single-layer or a multi-layer structure, and the bit line structures 111 may include polysilicon, metal or another applicable conductive material.

As shown in FIG. 1C, the bit line structures 111 and the hard masks 113 disposed on the semiconductor substrate 101 are arranged to intersect with the active regions 103 in the semiconductor substrate 101. The bit line structures 111 are electrically connected to the active regions 103 through the bit line contacts 109, and the input/output signals can be provided by the capacitor contacts which are formed subsequently and electrically connected to the external circuit.

Figure 2A:
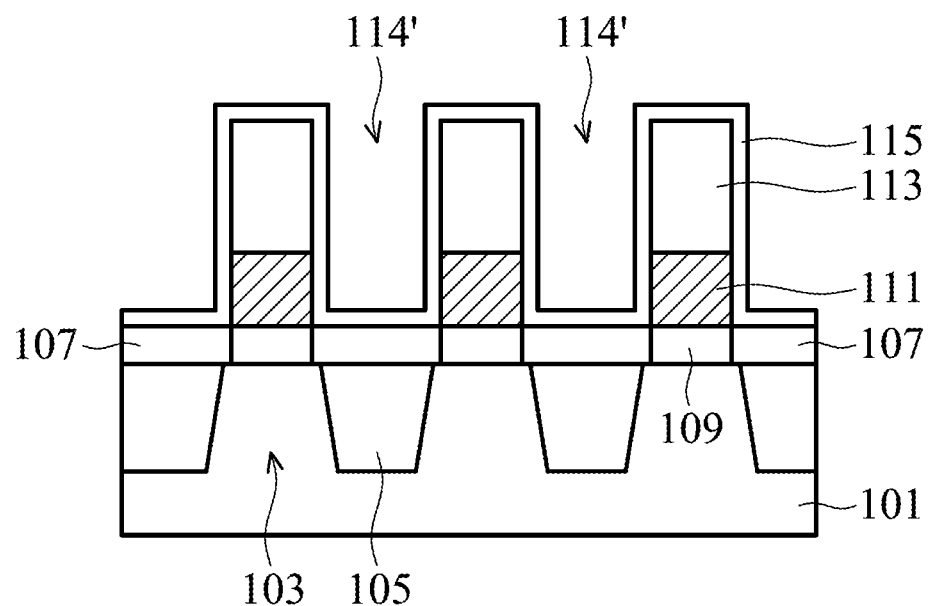
Figure 2B:
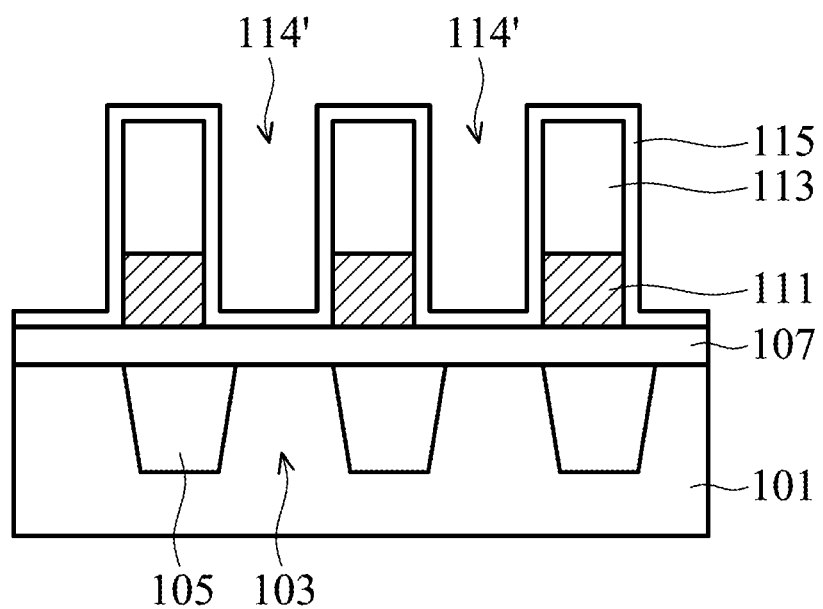
Figure 2C:
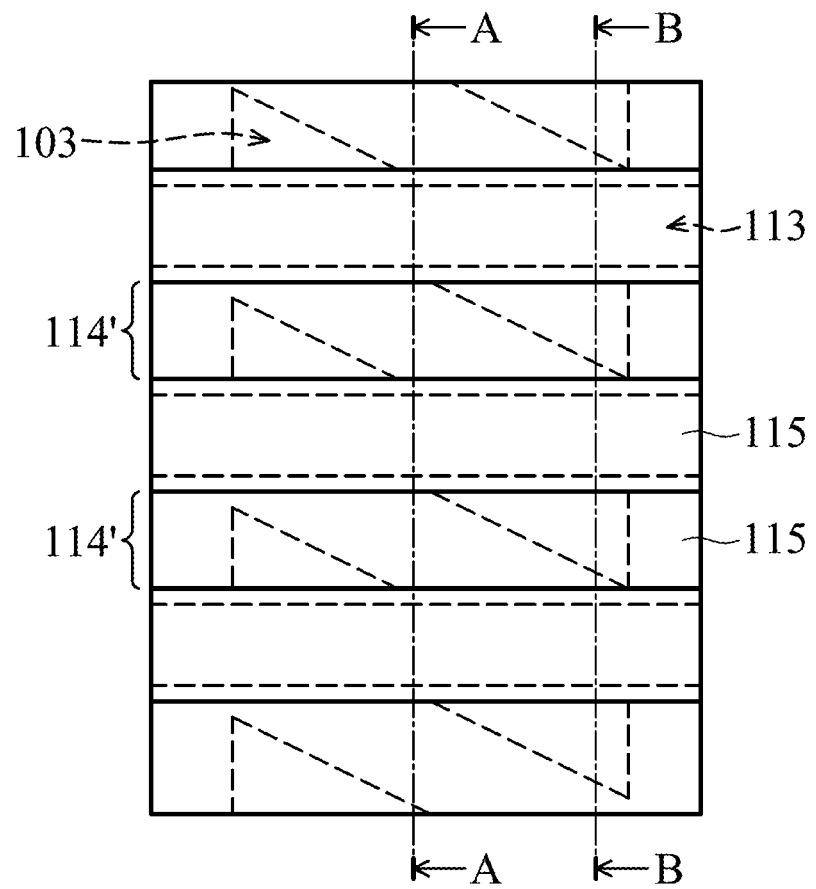

As shown in FIGS. 2A, 2B and 2C, a first oxide layer 115 is conformally formed on the insulating layer 107, the bit line structures 111 and the hard masks 113. More specifically, the top surface of the insulating layer 107, the sidewalls of the bit line structures 111, and the sidewalls and the top surface of the hard masks 113 are conformally covered by the first oxide layer 115. In other words, the trenches 114 are conformally filled by the first oxide layer 115, and the trenches with reduced size 114' are formed. In some embodiments, the first oxide layer 115 may be made of silicon oxide, and the first oxide layer 115 may be formed by using a chemical vapor deposition (CVD) process, or an atomic layer deposition (ALD) process.

Figure 3A:
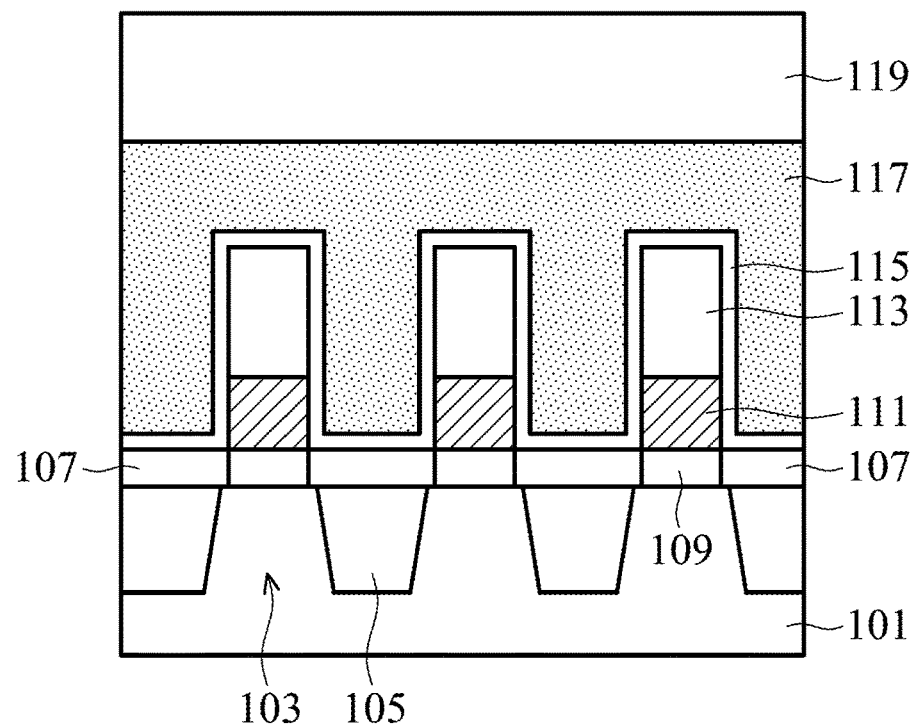
Figure 3B:
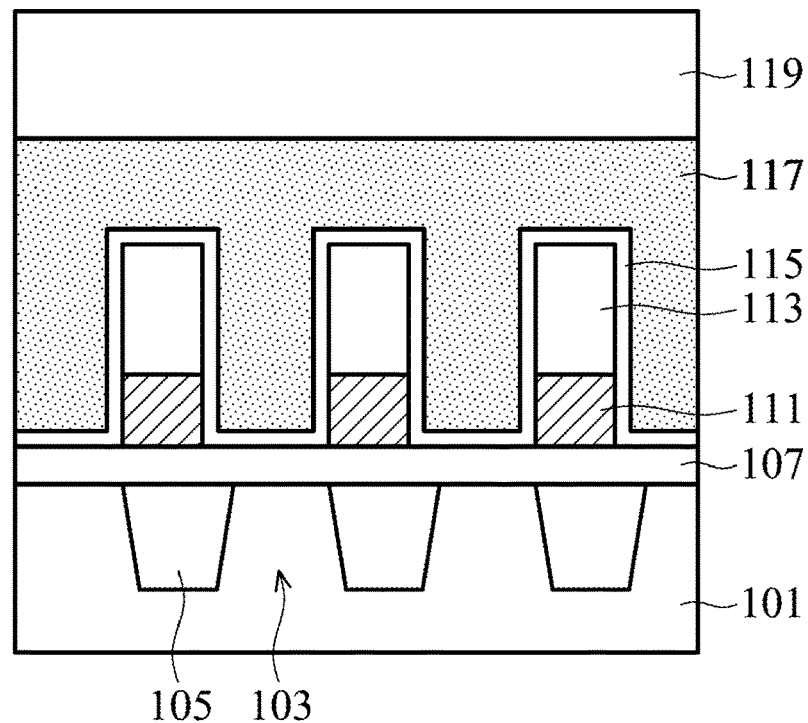
Figure 3C:
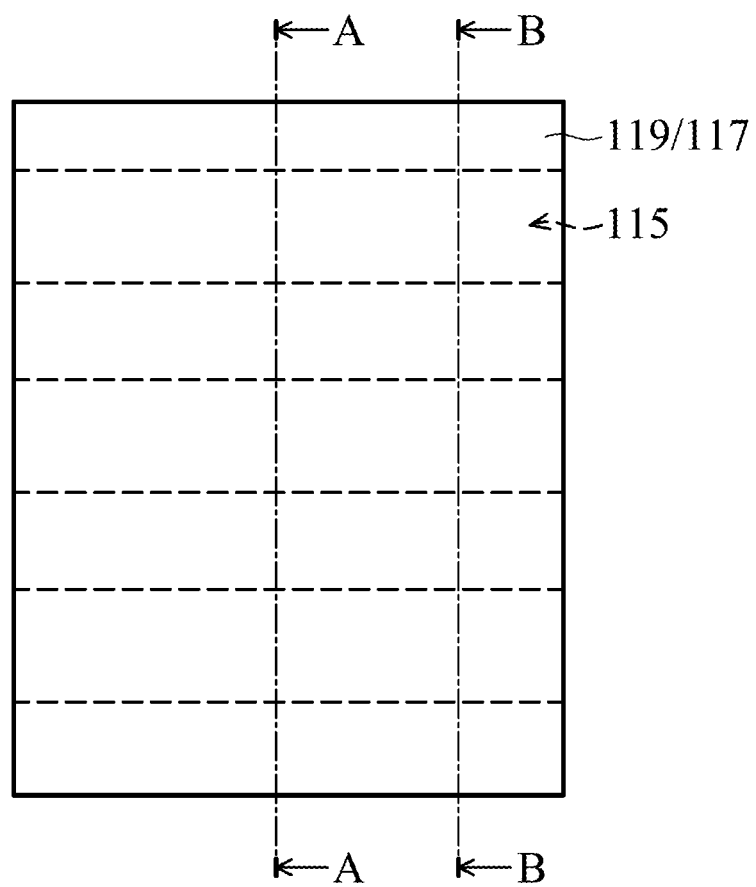

As shown in FIGS. 3A, 3B and 3C, a photoresist material layer 117 is formed on the first oxide layer 115 and in the trenches 114'. The photoresist material layer 117 may be made of a material having an etch selectivity that is higher than that of the material of the first oxide layer 115. In some embodiments, the photoresist material layer 117 may be made of carbon-based material, such as spin-on carbon (SoC), or another applicable material. The trenches 114' are filled up by the photoresist material layer 117, and the first oxide layer 115 is entirely covered by the photoresist material layer 117. Next, a hard mask layer 119 is formed on the photoresist material layer 117. The hard mask layer 119 may include low temperature oxide.

Figure 4A:
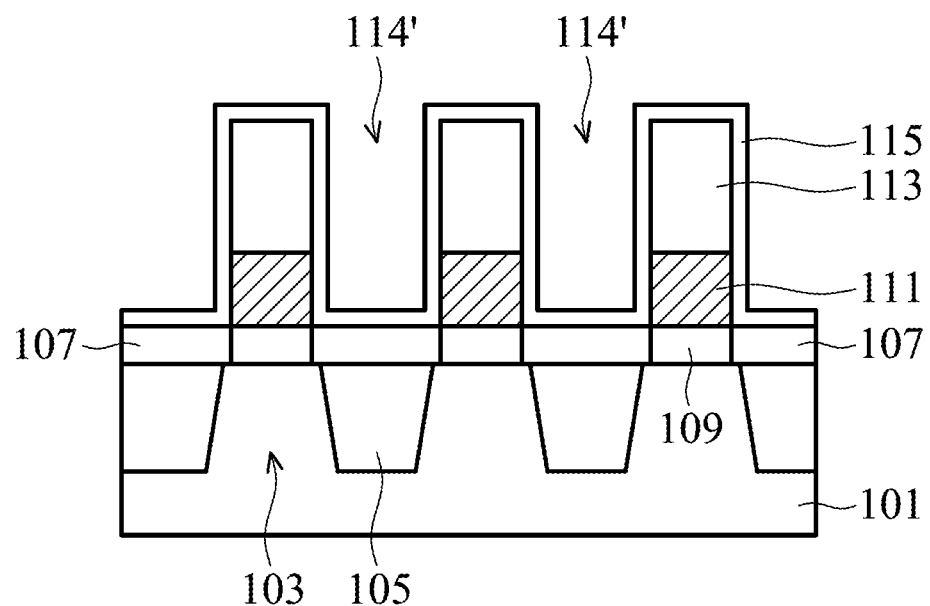
Figure 4B:
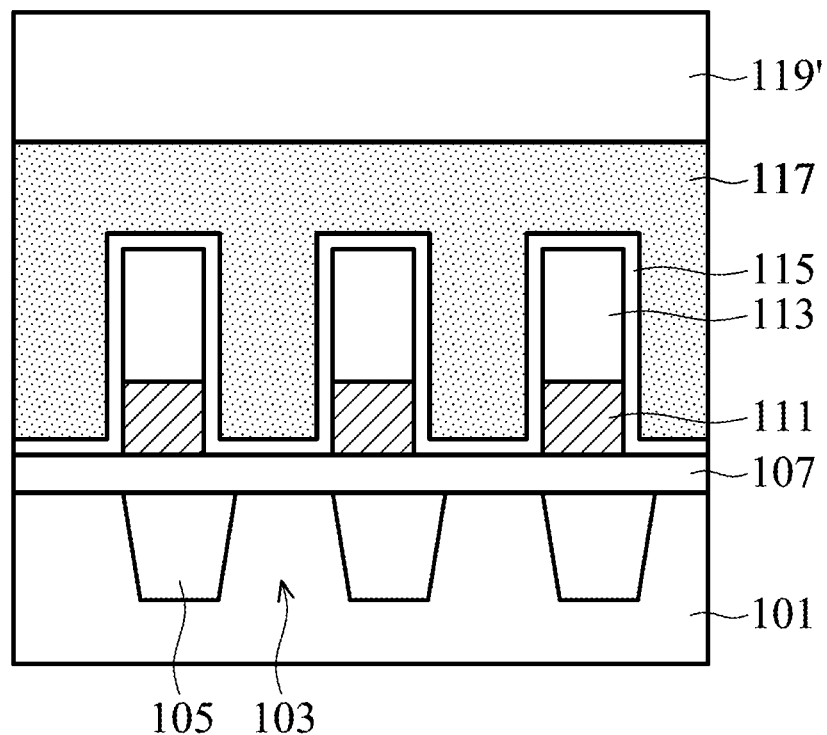
Figure 4C:
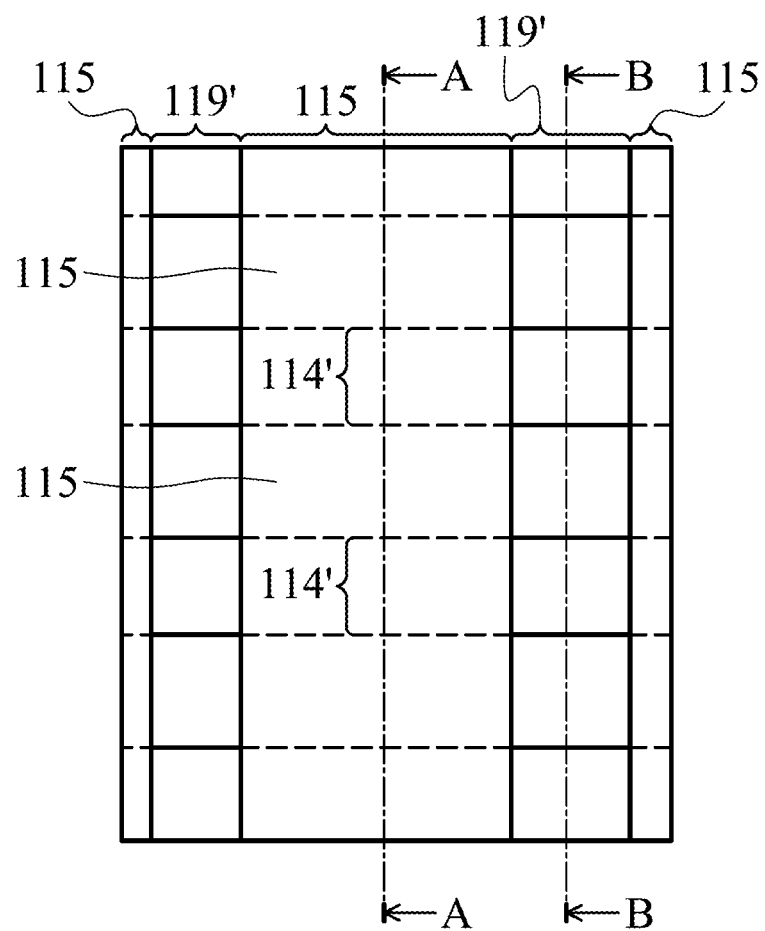

As shown in FIGS. 4A, 4B and 4C, the hard mask layer 119 is patterned to form a patterned hard mask layer 119' (referring to FIG. 4C). Then, a self-aligned contact (SAC) etching process is performed by using the patterned hard mask layer 119' as a mask to remove a portion of the photoresist material layer 117. Referring to FIG. 4C, the regions exposed by the patterned hard mask layer 119' are first regions (corresponding to the cross-section along line A-A), and the regions covered by the patterned hard mask layer 119' are second regions (corresponding to the cross-section along line B-B). The first regions and the second regions are arranged in a staggered manner, and the direction of the first regions and the second regions are perpendicular to the directions of the bit line structures 115. After performing the self-aligned contact etching process to remove the photoresist material layer 117 in the first regions, the first oxide layer 115 in the first regions is exposed. In other words, the trenches 114' in the first regions are exposed.

Since the etch selectivity of the photoresist material layer 117 is higher than the etch selectivity of the first oxide layer 115, after performing the self-aligned contact etching process, the first oxide layer 115 in the first regions is not removed substantially, such that the hard masks 113 and the bit line structures 111 in the first regions are protected by the first oxide layer 115 and are undamaged.

Figure 5A:
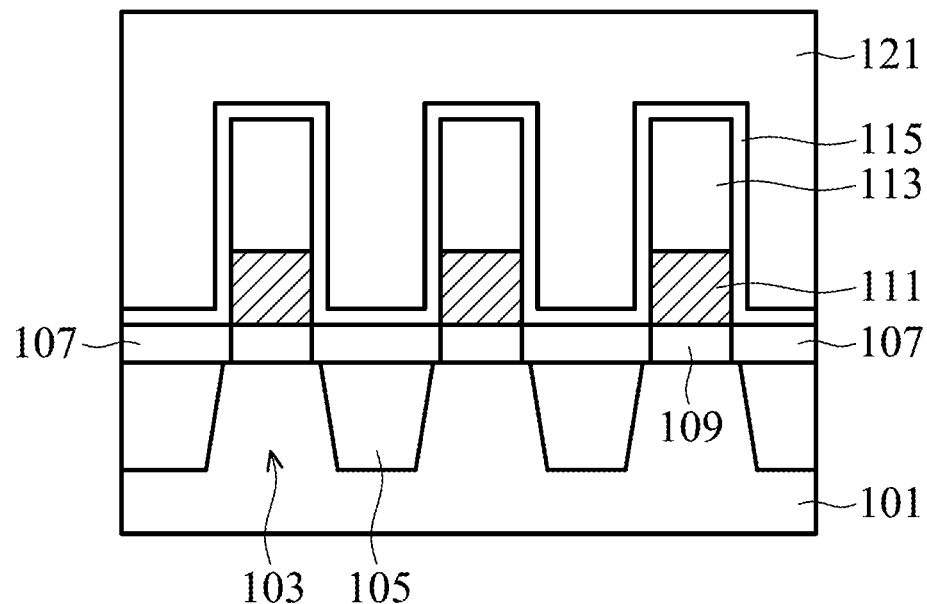
Figure 5B:
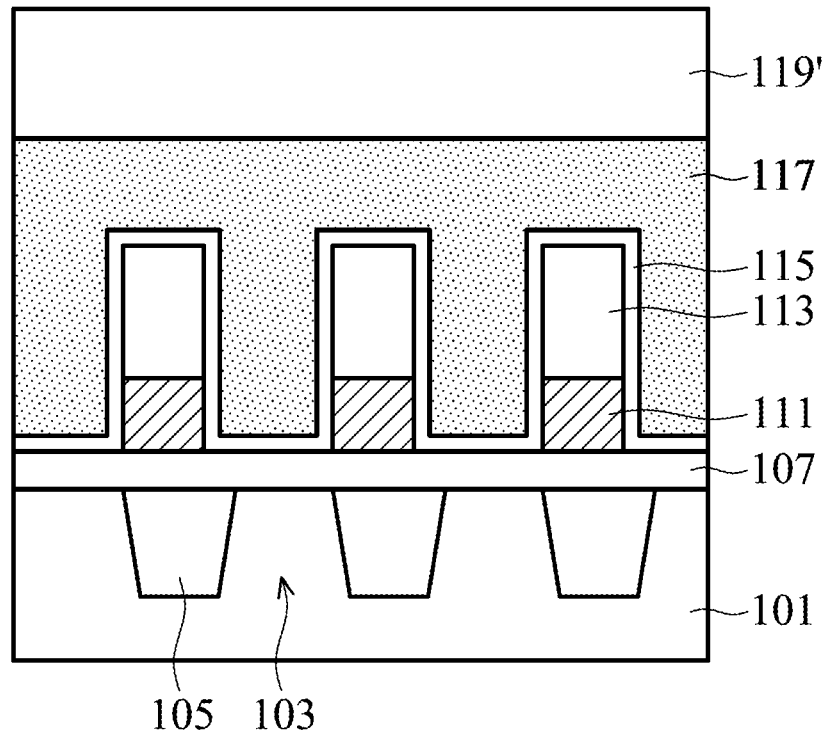
Figure 5C:
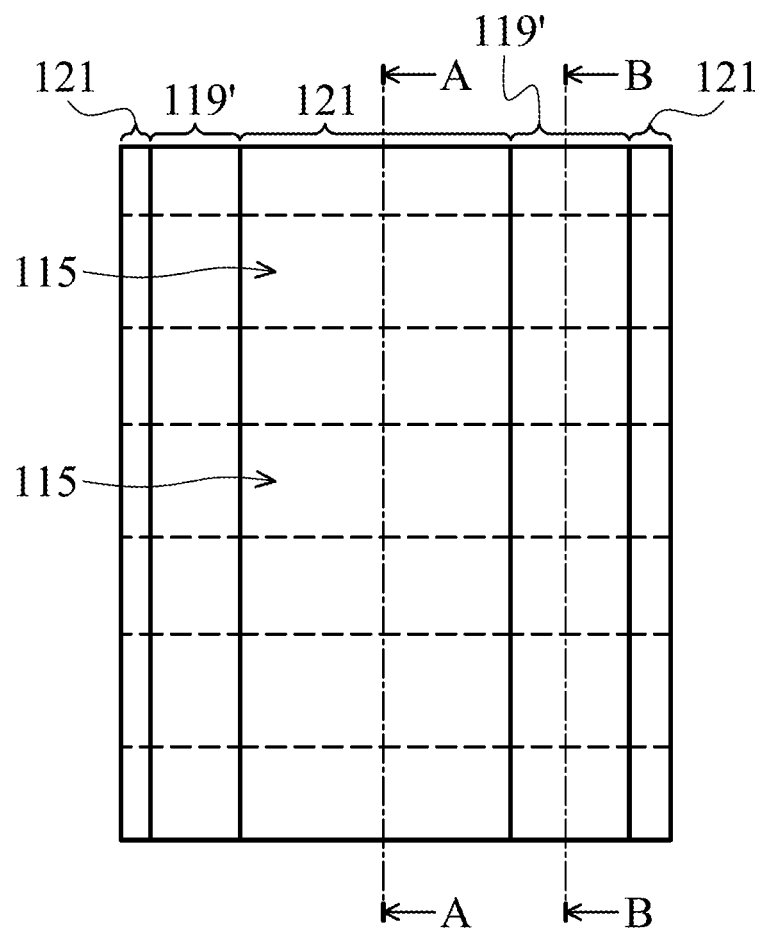

As shown in FIGS. 5A, 5B and 5C, a second oxide layer 121 is formed on the first oxide layer 115 exposed in the first regions. The trenches 114' exposed in the first regions are filled up by the second oxide layer 121, and the first oxide layer 115 exposed in the first regions are entirely covered by the second oxide layer 121. The second oxide layer 121 may include low temperature oxide. In some embodiments, the material of the second oxide layer 121 may be the same as the material of the hard mask layer 119.

Figure 6A:
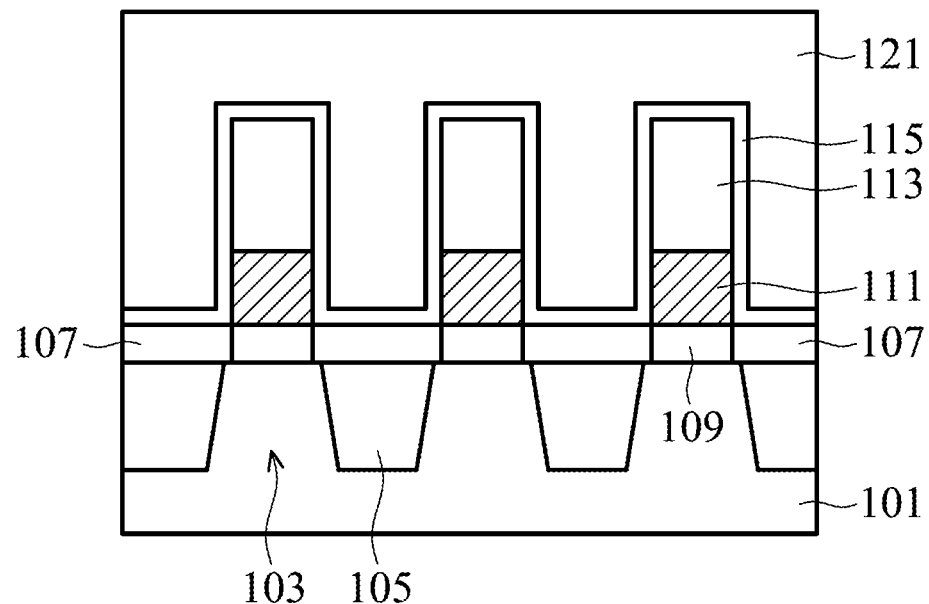
Figure 6B:
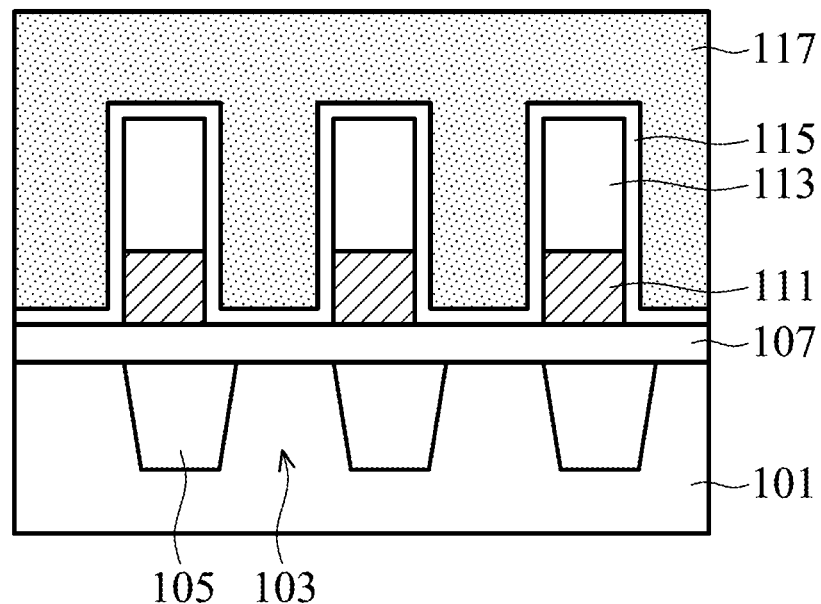
Figure 6C:
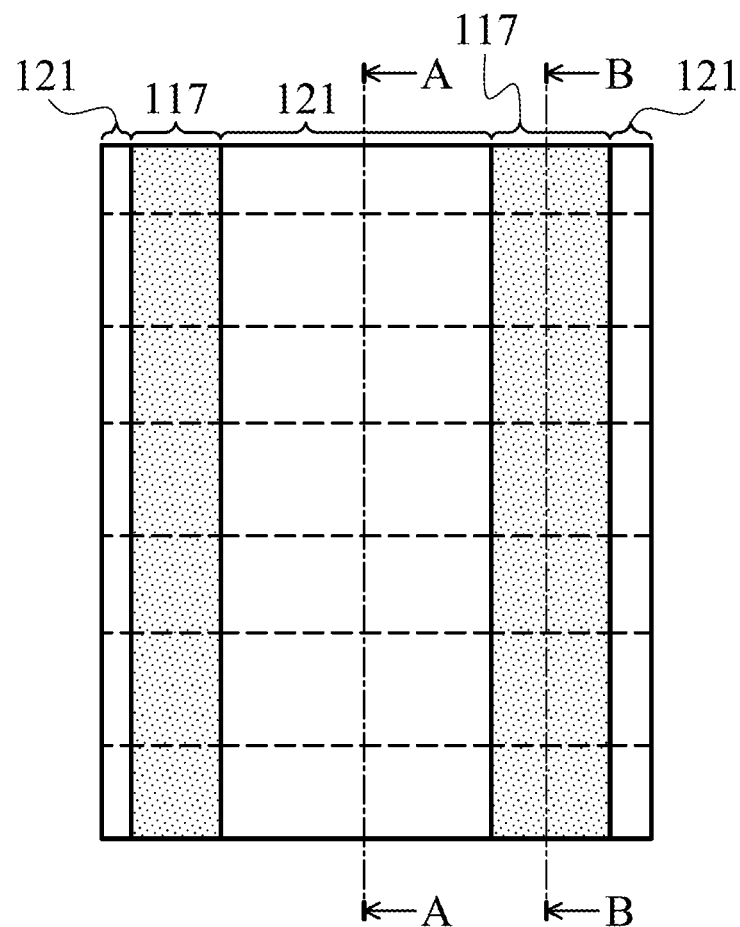

Next, as shown in FIGS. 6A, 6B and 6C, an etch back process is performed to remove the patterned hard mask layer 119' in the second regions so that the photoresist material layer 117 in the second regions is exposed. In some embodiments, since the material of the second oxide layer 121 of the first regions is the same as the material of the patterned hard mask layer 119' of the first regions, a portion of the second oxide layer 121 may also be removed by the etch back process. A dry etching or a wet etching process may be used in the etch back process.

Figure 7A:
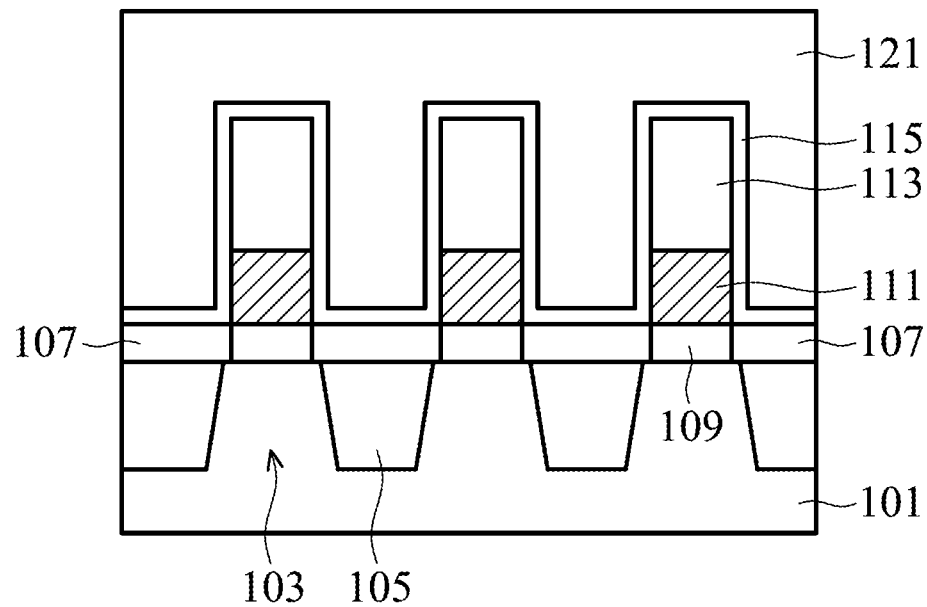
Figure 7B:
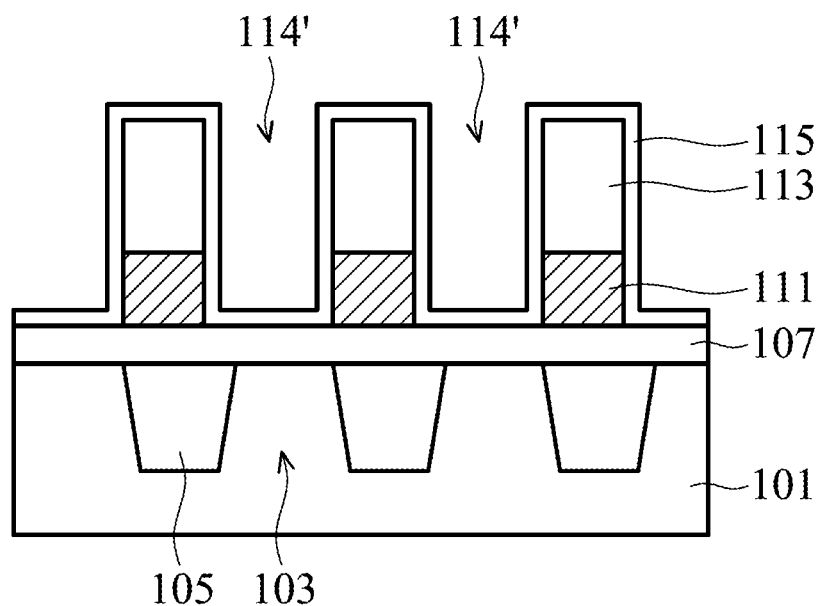
Figure 7C:
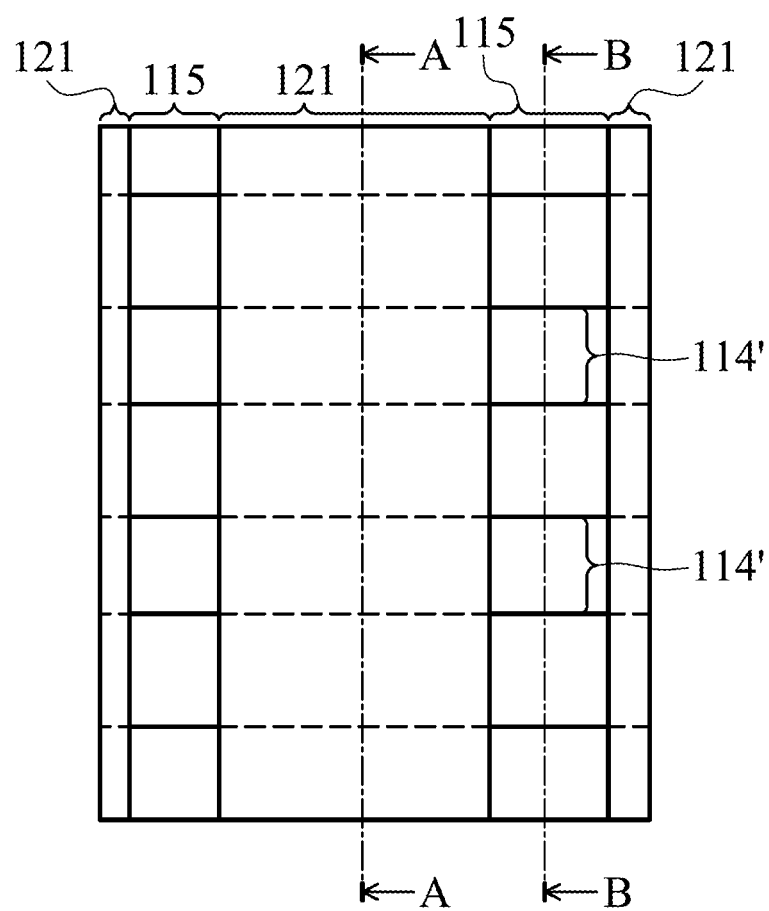

As shown in FIGS. 7A, 7B and 7C, the photoresist material layer 117 in the second regions is removed to expose the first oxide layer 115 in the second regions. In some embodiments, an ashing process is performed to remove the photoresist material layer 117 in the second regions. Specifically, the ashing process can be performed by using oxygen as an etchant at a high temperature. In some embodiments, the photoresist material layer 117 may be made of carbon-based material, and the inletting oxygen from the ashing process may react with the carbon-based material of the photoresist material layer 117 (such as spin-on carbon (SoC)) to produce carbon dioxide. Thus, the photoresist material layer 117 may be substantially removed.

Since the etch selectivity of the photoresist material layer 117 is higher than the etch selectivity of the first oxide layer 115, after performing the ashing process, the first oxide layer 115 in the second regions is not removed substantially, such that the hard masks 113 and the bit line structures 111 in the second regions are protected by the first oxide layer 115 and are undamaged. After performing the ashing process, the trenches 114' in the second regions are exposed.

Figure 8A:
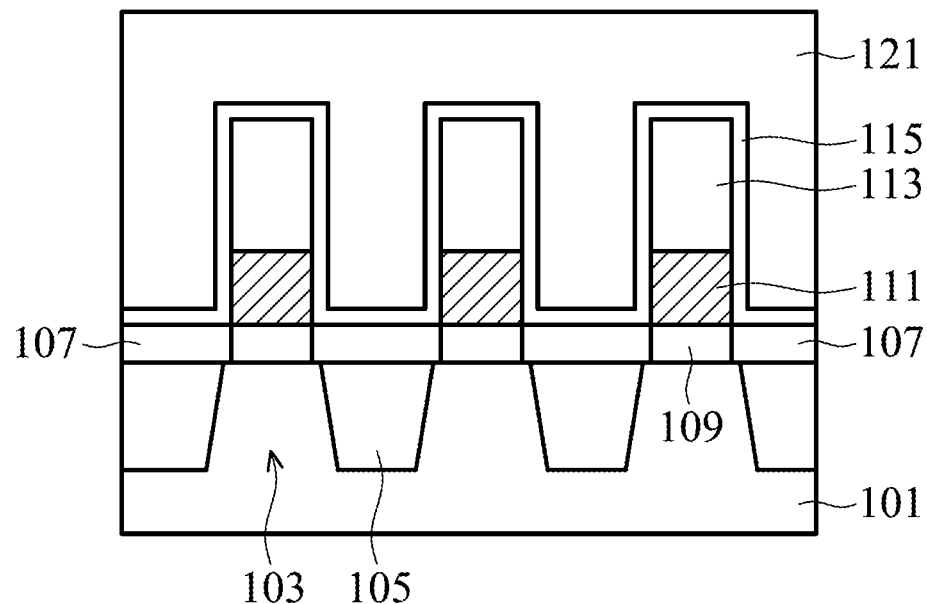
Figure 8B:
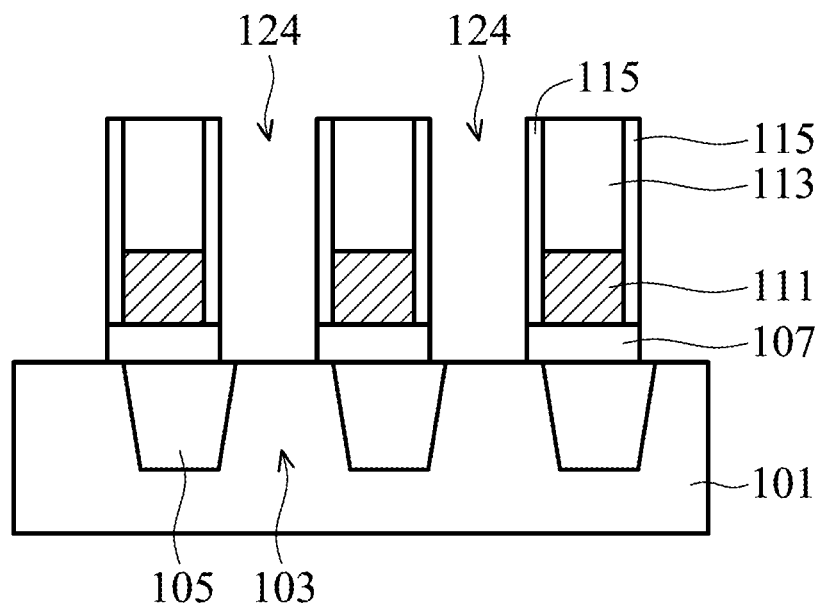
Figure 8C:
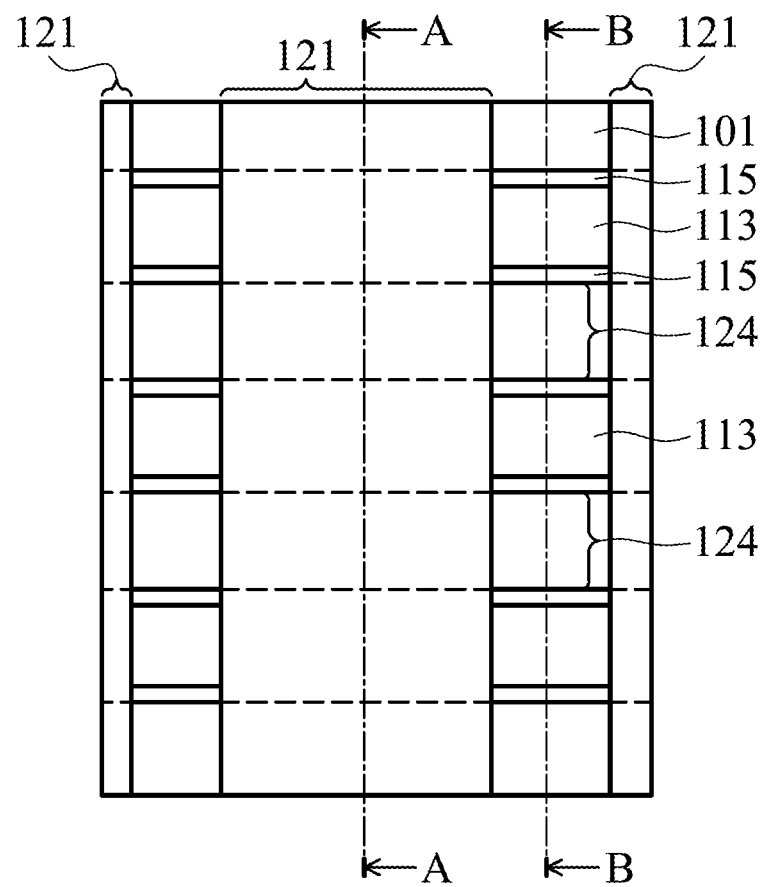

Then, as shown in FIGS. 8A, 8B and 8C, a dry etching process is performed to remove the horizontal portions of the first oxide layer 115 in the second regions and a portion of the insulating layer 107 on the active regions 103. Specifically, the portions of the first oxide layer 115 covering the top surfaces of the hard masks 113 and covering the top surfaces of the active regions 103 are removed. After performing the dry etching process, portions of the active regions 103 in the semiconductor substrate 101 are exposed, and a plurality of capacitor contact holes 124 are formed.

After performing the dry etching process, the first oxide layer 115 in the first regions is entirely covered by the second oxide layer 121, and the first oxide layer 115 in the second regions is formed into a plurality of separated portions, which become sidewall spacers between the hard masks 113 and the bit line structures 111. As shown in FIG. 8B, the sidewalls of the hard masks 113 and the sidewalls of the bit line structures 111 are entirely covered by the first oxide layer 115, and the top surfaces of the first oxide layer 115 are substantially coplanar with the top surfaces of the hard masks 113. In addition, the height difference between the top surfaces of the hard masks 113 in the first regions and in the second regions is small. The height difference between the hard masks 113 in these two regions is in a range from about 0 nm to about 10 nm.

Figure 9A:
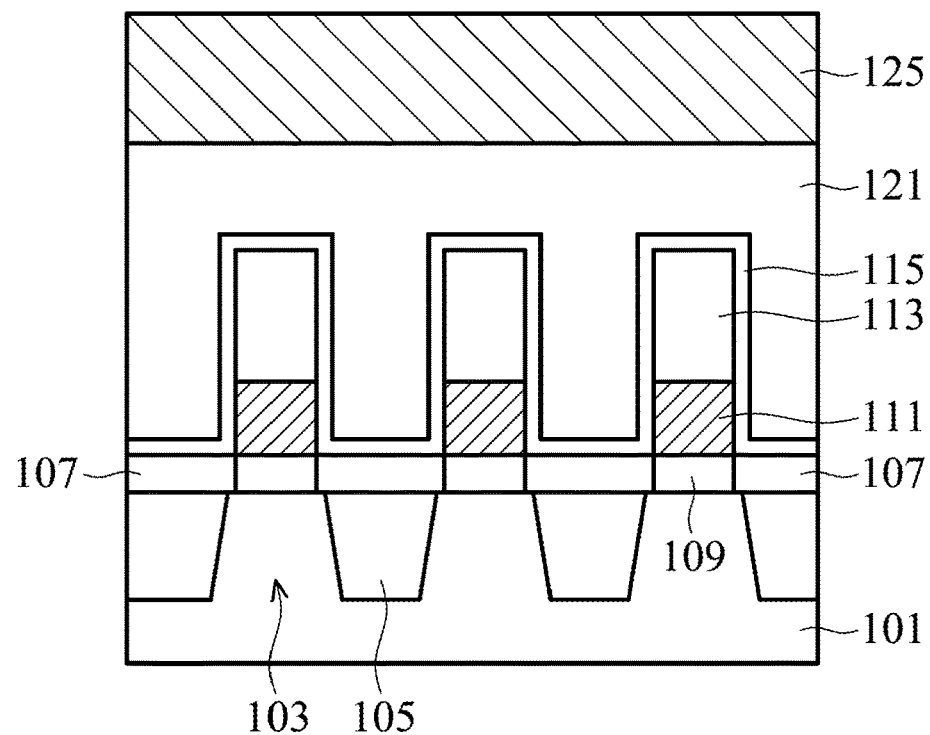
Figure 9B:
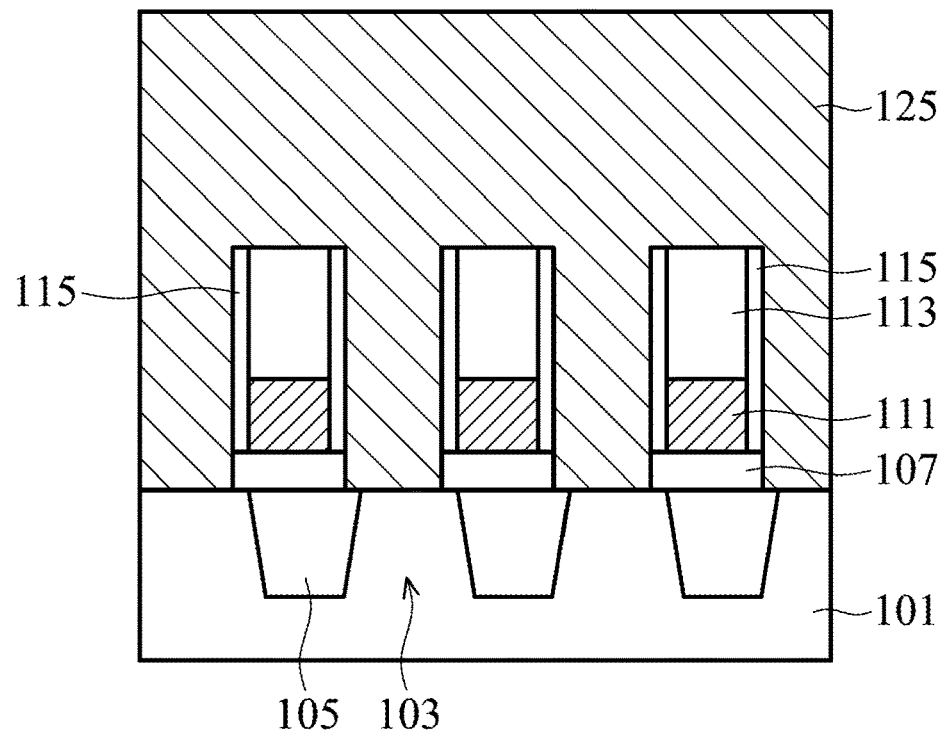
Figure 9C:
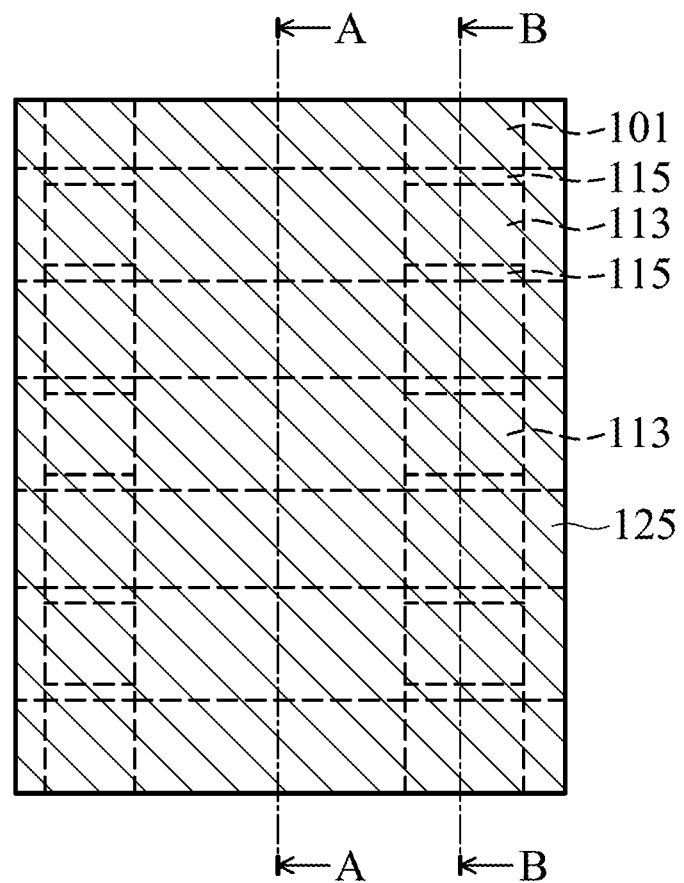

As shown in FIGS. 9A, 9B and 9C, a conductive material 125 is formed on the second oxide layer 121 in the first regions, and in the capacitor contact holes 124 in the second regions. The capacitor contact holes 124 are filled up by the conductive material 125, and the top surfaces of the hard masks 113 and the first oxide layer 115 are covered by the conductive material 125. In some embodiments, the conductive material 125 may be made of polysilicon, metal, or another applicable conductive material, and the conductive material 125 may be formed by using a chemical vapor deposition (CVD) process, or another applicable deposition process.

Figure 10A:
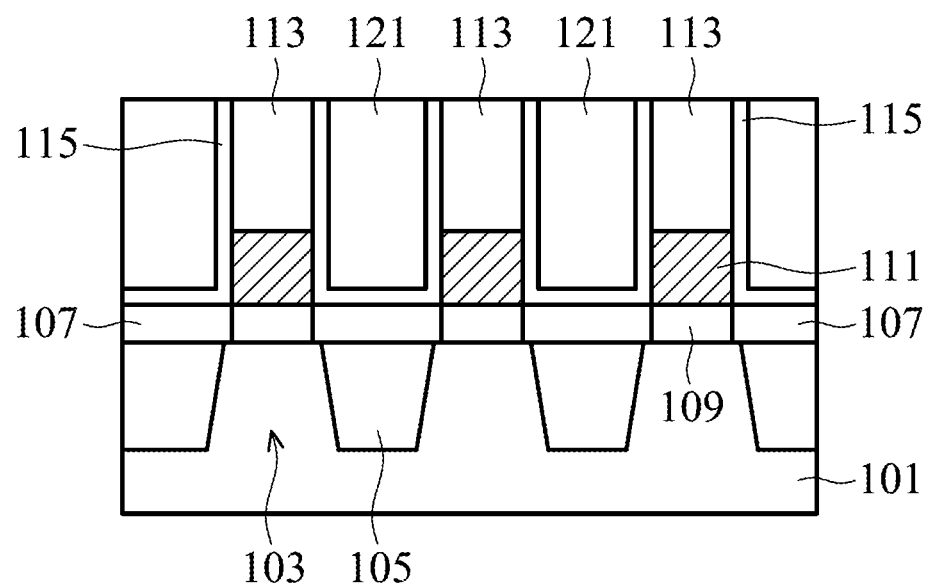
Figure 10B:
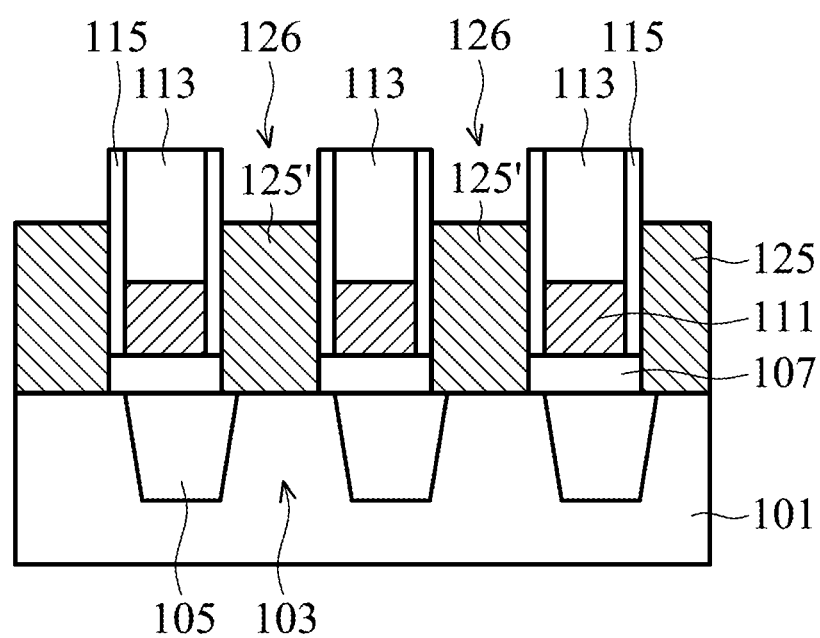
Figure 10C:
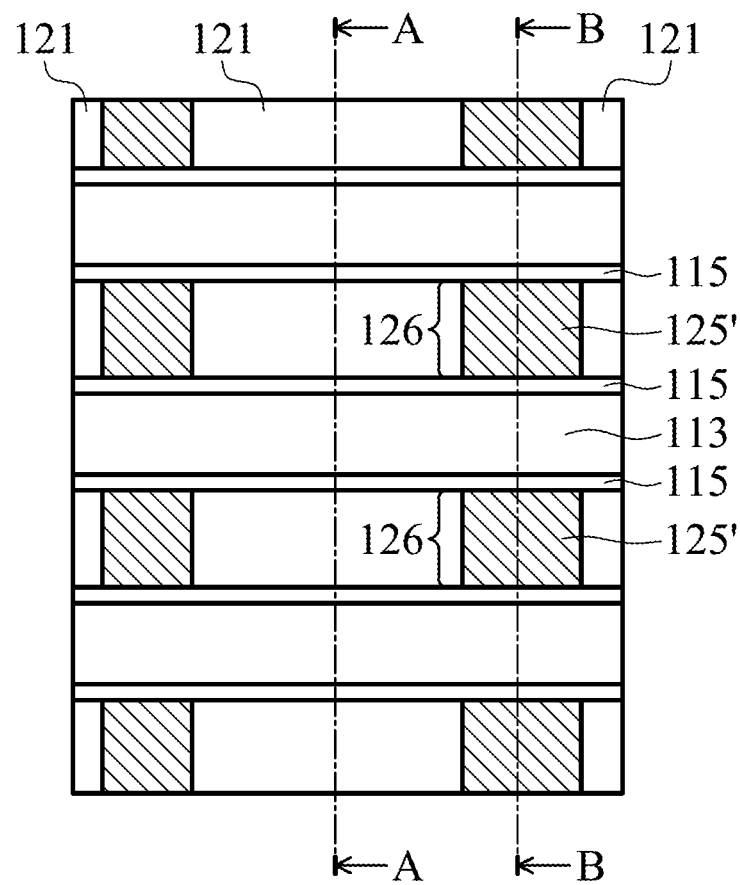

Next, as shown in FIGS. 10A, 10B and 10C, a planarization process, for example, a chemical mechanical polishing (CMP) process or a dry etching process, is performed to expose the hard masks 113. Then, an etch back process is performed to recess the conductive material 125 in the second regions so that contacts 125' and the recesses 126 on the contacts 125' are formed. In this embodiment, the top surfaces of the contacts 125' are higher than the top surfaces of the bit line structures 111. However, in other embodiments, the top surfaces of the contacts 125' may be level with or lower than the top surfaces of the bit line structures 111.

Figure 11A:
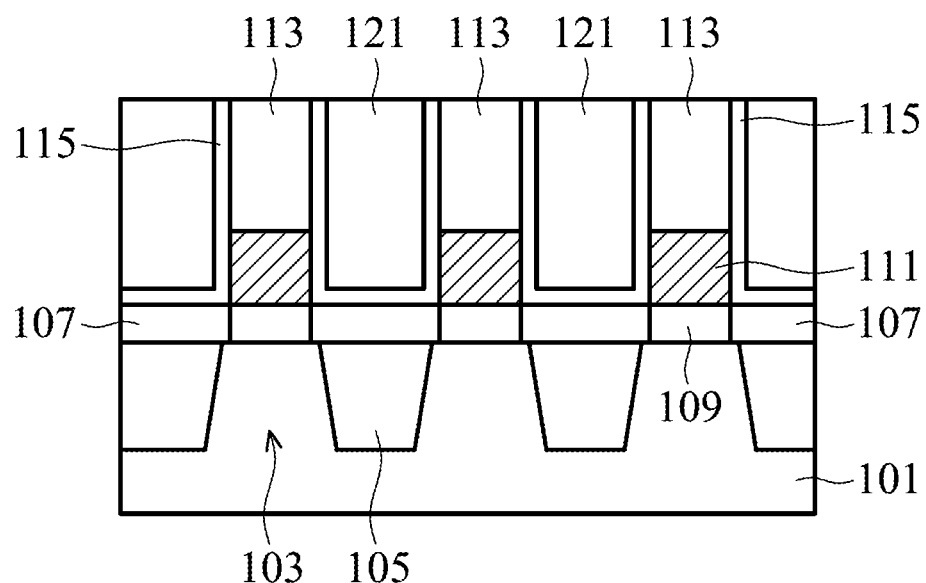
Figure 11B:
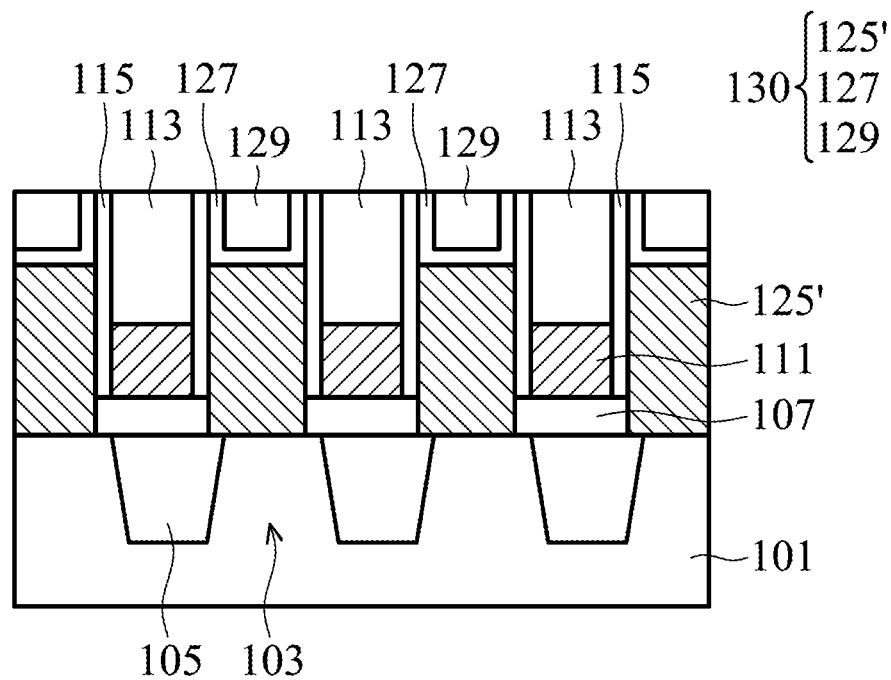
Figure 11C:
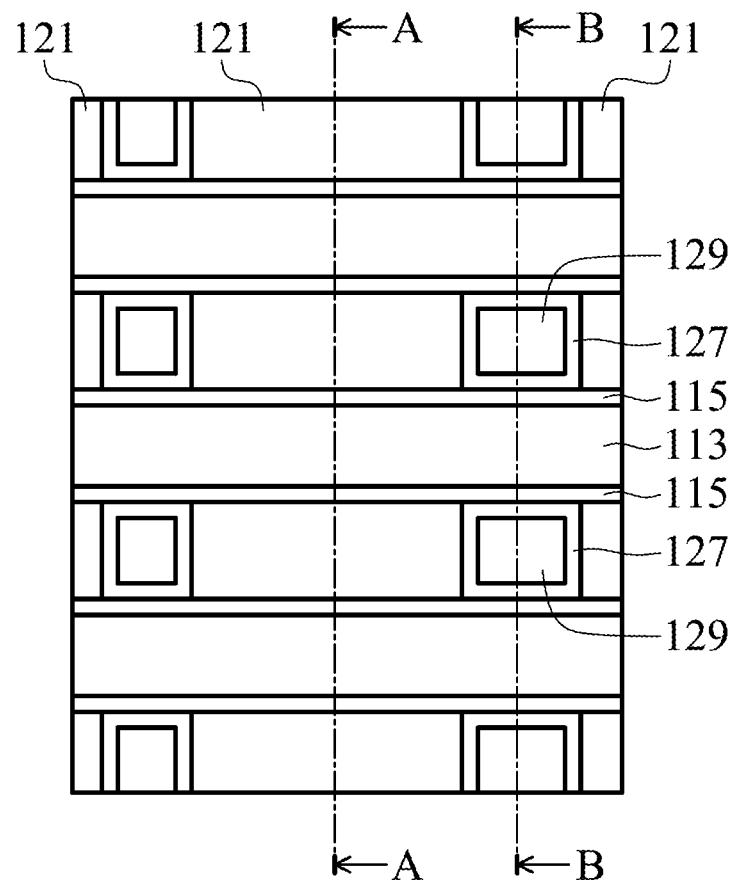

As shown in FIGS. 11A, 11B and 11C, a metal liner layer 127 is formed on the top surfaces of the contacts 125' and on the sidewalls of the recesses 126, and metal plugs 129 are formed on the metal liner layer 127. The top surfaces of the metal plugs 129 are coplanar with the top surface of the metal liner layer 127. The contacts 125', the metal liner 127 and the metal plugs 129 constitute the capacitor contacts 130. The capacitor contacts 130 are used to make electrically connections between the active regions 103 and the DRAM capacitors subsequently formed on the capacitor contacts 130. As shown in FIG. 8B, the capacitor contact holes 124 are filled by the capacitor contacts 130, and the capacitor contacts 130 are located between the bit line structures 111.

In some embodiments, a metal liner material (not shown) is formed conformally covering the hard masks 113, the first oxide layer 115, the second oxide layer 121 and the contacts 125'. The metal liner material may be made of titanium (Ti), titanium nitride (TiN), tantalum (Ta), tantalum nitride (TaN) or another applicable metal. Then, a metal material (not shown) is deposited on the metal liner material. The metal material may be made of tungsten (W) or another applicable metal.

Subsequently, a planarization process, for example, a chemical mechanical polishing (CMP) process or a dry etching process, is performed to remove the metal material and the metal liner material on the top surfaces of the second oxide layer 121, the first oxide layer 115 and the hard masks 113, and the top surfaces of the second oxide layer 121, the first oxide layer 115 and the hard masks 113 are exposed. After performing the planarization process, the metal material and the metal liner material remain in the recesses 126 become the metal liner layer 127 and the metal plugs 129, and the manufacturing processes of the capacitor contacts 130 are complete. In addition, in some embodiments, a metal silicide (not shown), such as titanium silicide (TiSi), cobalt silicide (CoSi), nickel silicide (NiSi), tantalum silicide (TaSi), or a combination thereof, may be formed on the interfaces between the metal liner layer 127 and the contacts 125'.

Figure 12A:
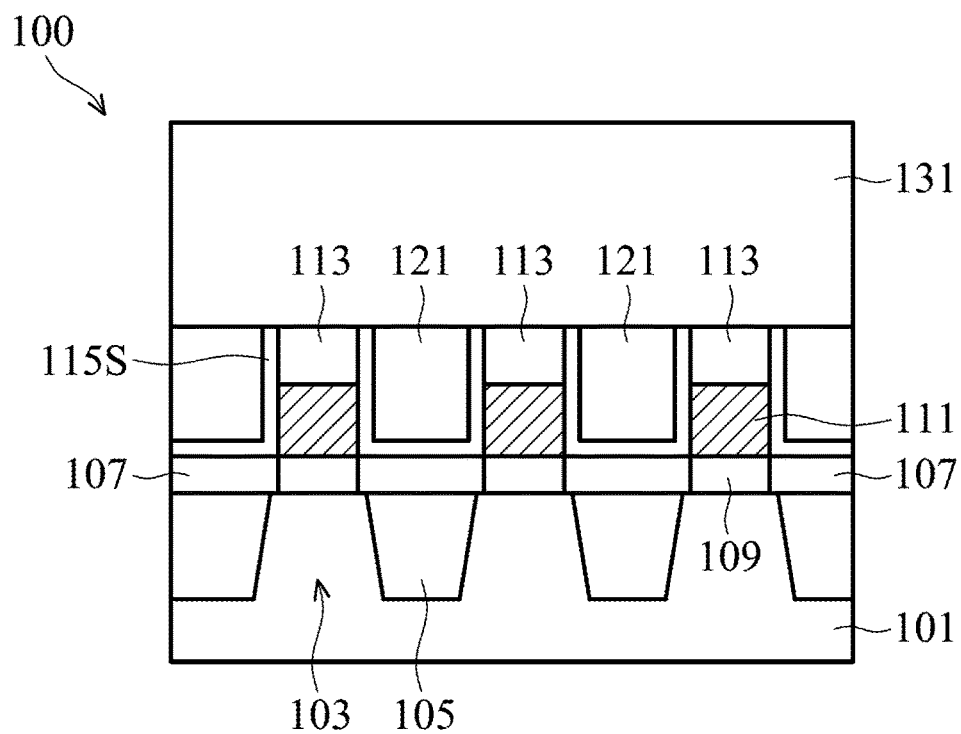
Figure 12B:
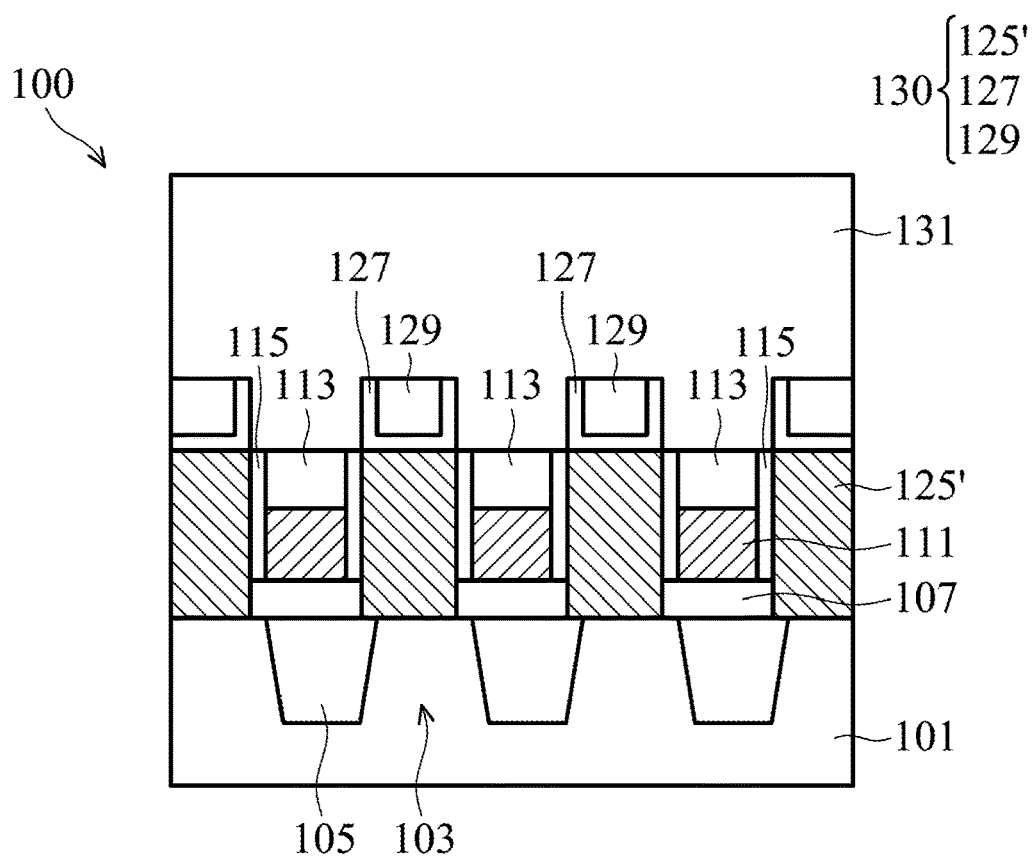
Figure 12C:
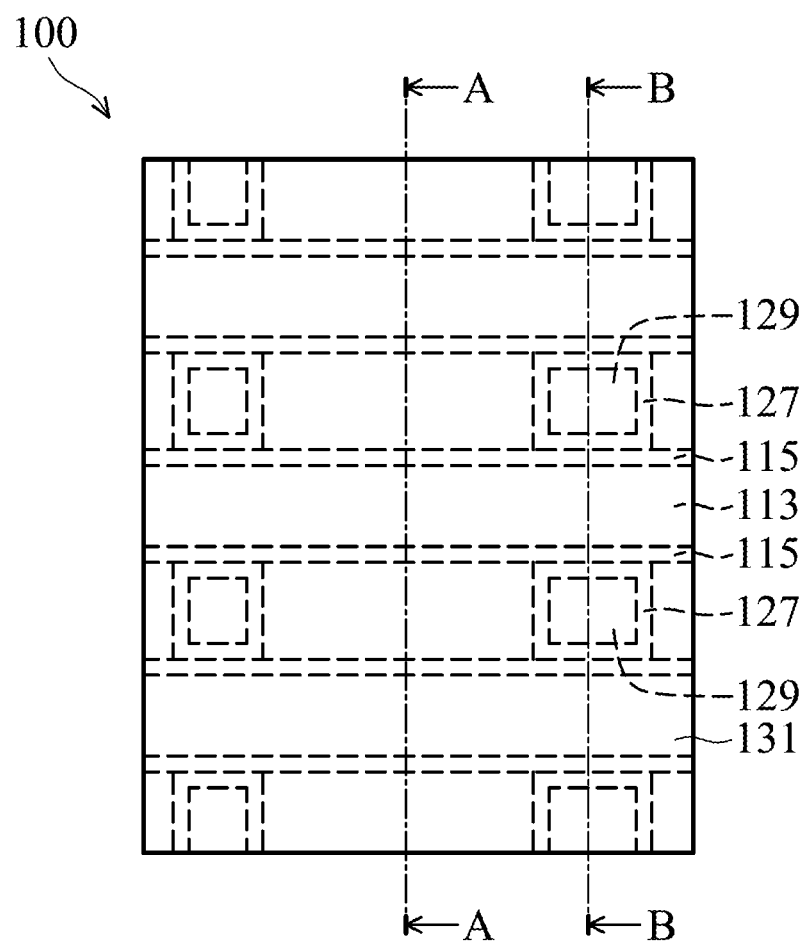

Next, as shown in FIGS. 12A, 12B and 12C, a dry etching or a wet etching process is performed to remove a portion of the hard masks 113, a portion of the first oxide layer 115 and a portion of the second oxide layer 121, such that the top surfaces of the capacitor contacts 130 are higher than the top surfaces of the second oxide layer 121, the first oxide layer 115 and the hard masks 113. Then, a nitride layer 131 is formed on the hard masks 113, the first oxide layer 115, the second oxide layer 121 and the capacitor contacts 130. Then, the semiconductor device 100 is complete. It is worth noting that, the nitride layer 131 contacts the top surface of the first oxide layer 115, and the bottom surface of the nitride layer 131 is higher than the top surfaces of the bit line structures 111.

In some embodiments, the nitride layer 131 may include silicon nitride, and the nitride layer 131 may be formed by using a chemical vapor deposition (CVD) or another applicable deposition process. The nitride layer 131 may be etched subsequently to form the DRAM capacitors on the semiconductor device 100. For example, a portion of the nitride layer 131 may be etched away to expose the metal liner layer 127 and/or the metal plugs 129, and a conductive material may be filled in to make electrically connections between the semiconductor device 100 and the DRAM capacitors formed subsequently.

It is worth noting that, the bit line structures 111 are separated from the capacitor contacts 130 by the first oxide layer 115. Specifically, the first oxide layer 115 is located between the bit line structures 111 and the capacitor contacts 130, and the first oxide layer 115 contacts the bit line structures 111 and the capacitor contacts 130. Since the dielectric constant of oxide is smaller than the dielectric constant of nitride (the dielectric constant of nitride is about 7, and the dielectric constant of oxide is about 3.8 to 4), the parasitic capacitance between the bit line and the capacitor contact of the semiconductor device 100 can be decreased effectively. As a result, the amplified signal of the capacitor ($\Delta V_{BL}$) can be increased.

Moreover, in some embodiments, the bit line structures 111 of the semiconductor device 100 are entirely covered by the hard masks 113, the first oxide layer 115 and the insulating layer 107, and the hard masks 113, the first oxide layer 115 and the insulating layer 107 are all made of oxide. Therefore, the high difference between the etch selectivities of the oxide and the photoresist material layer, such as spin-on carbon, can be utilized, and the ashing process can be used to form the capacitor contacts 124 effectively and precisely. As a result, the residue, which may cause increasing resistance of the capacitor contacts 130 formed subsequently, remains in the capacitor contacts 124 can be prevented from happening.

Furthermore, some embodiments of the disclosure use the hard masks, which are made of silicon oxide. In the subsequently etching process of forming the capacitor contact holes 124, by choosing the materials which have specific etch selectivities, the hard masks 113, which are made of silicon oxide, can be prevented from being over consumed. Therefore, the heights of the hard masks 113 can be decreased, such that the aspect ratio (A/R) of the trenches 114 between the bit line structures 111 can be decreased. As a result, the etching process for forming the bit line structures 111 can be easily performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
    forming a plurality of bit line structures on a semiconductor substrate, wherein there is a plurality of trenches between the plurality of bit line structures;
    forming a first oxide layer conformally covering the plurality of bit line structures and the plurality of trenches;
    forming a photoresist material layer in the plurality of trenches and on the first oxide layer, wherein the photoresist material layer has an etch selectivity that is higher than that of the first oxide layer;
    removing the photoresist material layer in a first region to expose the first oxide layer in the first region;
    forming a second oxide layer on the first oxide layer in the first region;
    removing the photoresist material layer and horizontal portions of the first oxide layer in a second region to form a plurality of capacitor contact holes between the plurality of bit line structures, wherein the first region and the second region are arranged in a staggered manner; and
    forming a capacitor contact in each of the plurality of capacitor contact holes.

2. The method as claimed in claim 1, further comprising:
    forming a plurality of hard masks on the plurality of bit line structures, wherein top surfaces of the plurality of bit line structures contact the plurality of hard masks, and sidewalls of the plurality of bit line structures contact the first oxide layer.

3. The method as claimed in claim 2, wherein the first oxide layer covers all the sidewalls of the plurality of bit line structures and the plurality of hard masks.

4. The method as claimed in claim 2, wherein the plurality of hard masks are made of oxide, and the top surfaces and the sidewalls of the plurality of bit line structures are entirely covered by the plurality of hard masks and the first oxide layer.

5. The method as claimed in claim 1, wherein the photoresist material layer is made of a carbon-based material.

6. The method as claimed in claim 1, wherein
    directions of the first region and the second region are perpendicular to directions of the plurality of bit line structures.

7. The method as claimed in claim 6, further comprising:
    performing a dry etching process to remove horizontal portions of the first oxide layer in the second region until the semiconductor substrate is exposed and the plurality of capacitor contact holes are formed.

8. The method as claimed in claim 6, wherein removing the photoresist material layer in the first region to expose the first oxide layer in the first region further comprises:
    forming a patterned mask on the photoresist material layer in the second region, wherein the patterned mask exposes the photoresist material layer in the first region, and the patterned mask is made of oxide; and
    performing a self-aligned contact etching process to remove the photoresist material layer in the first region.

9. The method as claimed in claim 6, wherein removing the photoresist material layer in the second region to expose the first oxide layer in the second region further comprises performing an ashing process.

10. The method as claimed in claim 9, wherein the ashing process uses oxygen as an etchant at a high temperature.

11. The method as claimed in claim 1, further comprising:
    forming a plurality of isolation structures in the semiconductor substrate, wherein a plurality of active regions are defined by the plurality of isolation structures, and portions of the plurality of active regions are exposed by the plurality of capacitor contact holes; and
    forming a plurality of bit line contacts between the plurality of active regions and the plurality of bit line structures, wherein the plurality of bit line structures are electrically connected to the plurality of active regions through the plurality of bit line contacts.

12. The method as claimed in claim 1, wherein forming the capacitor contact in the plurality of capacitor contact holes further comprises:
    forming a contact in the plurality of capacitor contact holes;
    forming a metal liner layer on the contact and on sidewalls of the first oxide layer; and
    forming a metal plug on the metal liner layer, wherein the metal plug has a top surface that is coplanar with a top surface of the metal liner layer, wherein the contact, the metal liner layer and the metal plug constitute the capacitor contact.

13. The method as claimed in claim 1, wherein the first oxide layer is located between the plurality of bit line structures and the plurality of capacitor contact, and the first oxide layer contacts the plurality of bit line structures and the capacitor contact.

14. The method as claimed in claim 1, further comprising:
  forming a nitride layer on the plurality of bit line structures, the first oxide layer and the capacitor contact, wherein a bottom surface of the nitride layer is higher than top surfaces of the plurality of bit line structures.

* * * * *